US011296177B2

(12) United States Patent
Roh

(10) Patent No.: US 11,296,177 B2
(45) Date of Patent: Apr. 5, 2022

(54) DISPLAY DEVICE WITH CURABLE PATTERN BETWEEN LEAD WIRINGS AND METHOD OF FABRICATING THE SAME

(71) Applicant: Samsung Display Co., LTD., Yongin-si (KR)

(72) Inventor: Myong Hoon Roh, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 112 days.

(21) Appl. No.: 16/726,245

(22) Filed: Dec. 24, 2019

(65) Prior Publication Data

US 2020/0357876 A1    Nov. 12, 2020

(30) Foreign Application Priority Data

May 8, 2019    (KR) .......................... 10-2019-0053975

(51) Int. Cl.
*H01L 27/32* (2006.01)
*H01L 51/00* (2006.01)
*H01L 51/56* (2006.01)
*H01L 51/52* (2006.01)

(52) U.S. Cl.
CPC ...... *H01L 27/3276* (2013.01); *H01L 51/0027* (2013.01); *H01L 51/5246* (2013.01); *H01L 51/56* (2013.01)

(58) Field of Classification Search
CPC ............. H01L 27/3276; H01L 51/0027; H01L 51/5246; H01L 51/56
See application file for complete search history.

(56) References Cited

U.S. PATENT DOCUMENTS

| 7,109,058 B2 | 9/2006 | Yamada et al. | |
| 2012/0092817 A1* | 4/2012 | Shibahara | G02F 1/13452 |
| | | | 361/679.01 |
| 2015/0251393 A1* | 9/2015 | Kanna | B32B 37/14 |
| | | | 428/334 |
| 2017/0334165 A1* | 11/2017 | Aritoshi | B32B 27/32 |
| 2018/0131031 A1 | 5/2018 | Ku et al. | |
| 2019/0012031 A1* | 1/2019 | Kim | H01L 51/5203 |
| 2019/0363287 A1* | 11/2019 | Kishimoto | C23C 16/483 |

FOREIGN PATENT DOCUMENTS

KR    10-2003-0081451    10/2003

* cited by examiner

*Primary Examiner* — Lex H Malsawma
(74) *Attorney, Agent, or Firm* — H.C. Park & Associates, PLC

(57) ABSTRACT

A display device including a display panel including a display substrate having a display area and a pad area around the display area, and a plurality of signal wirings disposed in the pad area of the display substrate, a base film attached to the pad area of the display substrate, a plurality of lead wirings disposed on the base film and connected to the plurality of signal wirings, and a first curable pattern disposed between adjacent ones of the lead wirings, in which a surface height of the first curable pattern from a surface of the base film is less than a surface height of the lead wirings from the surface of the base film.

20 Claims, 15 Drawing Sheets

DISPLAY DEVICE WITH CURABLE PATTERN BETWEEN LEAD WIRINGS AND METHOD OF FABRICATING THE SAME

CROSS-REFERENCE TO RELATED APPLICATION

This application claims priority from the benefit of Korean Patent Application No. 10-2019-0053975 filed on May 8, 2019, which is hereby incorporated by reference for all purposes as if fully set forth herein.

BACKGROUND

Field

Exemplary embodiments of the invention relate generally to a display device and a method of manufacturing the same and, more specifically, to a display device having an improved reliability, and a method for manufacturing a display device.

Discussion of the Background

Display devices display data graphically. Such a display device includes a substrate, on which a display area and a non-display area are defined. In general, a plurality of pixels is disposed on the substrate in the display area, and a plurality of pads and the like are disposed on the substrate in the non-display area. A flexible film, such as chip-on-film (COF) film on which a driving circuit and the like are mounted, is bonded to the plurality of pads to transmit driving signals to the pixels.

The flexible film may include a plurality of leads bonded with the plurality of pads. Each of the leads may be bonded to the pads separated from one another. The leads may be bonded to the pads via an ultrasonic bonding process or the like.

The above information disclosed in this Background section is only for understanding of the background of the inventive concepts, and, therefore, it may contain information that does not constitute prior art.

SUMMARY

Display devices constructed according to exemplary embodiments of the invention are capable of preventing a lead line from being peeled off from a base film of a printed circuit board.

Additional features of the inventive concepts will be set forth in the description which follows, and in part will be apparent from the description, or may be learned by practice of the inventive concepts.

A display device including a display panel including a display substrate having a display area and a pad area around the display area, and a plurality of signal wirings disposed in the pad area of the display substrate, a base film attached to the pad area of the display substrate, a plurality of lead wirings disposed on the base film and connected to the plurality of signal wirings, and a first curable pattern disposed between adjacent ones of the lead wirings, in which a surface height of the first curable pattern from a surface of the base film is less than a surface height of the lead wirings from the surface of the base film The first curable pattern may be spaced apart from the display substrate.

The first curable pattern may be in contact with the surface of the base film and at least a part of the side surface of the lead wirings.

The first curable pattern may be bonded with the surface of the base film and at least a part of the side surface of the lead wirings.

The display device may further include a second curable pattern disposed between adjacent ones of the signal wirings on the display substrate, in which a first portion of the second curable pattern contacts the first curable pattern and a second portion of the second curable pattern does not contact the first curable pattern, the second curable pattern being partially in contact with the first curable pattern with voids formed therebetween.

The first curable pattern may expose a lower end of a side surface of each of the lead wirings, and the second curable pattern may be in contact with the exposed lower end of the side surface of the lead wirings.

The first curable pattern may be in contact with a lower surface of each of the lead wirings that faces an upper surface of a respective one of the signal wirings, and with an upper surface of each of the signal wirings.

The first curable pattern may include a curable resin having a first average curing rate, and the second curable pattern may include a curable resin having a second average curing rate less than the first average curing rate.

The second curable pattern may be disposed closer to the display area than the first curable pattern.

The display device may further include an organic insulation pattern disposed on the display substrate and disposed between adjacent ones of the signal wirings, in which the second curable pattern may be disposed between the organic insulation pattern and the first curable pattern.

The lower surface of the first curable pattern that faces the organic insulation pattern may include a first lower surface having a first roughness and a second lower surface having a second roughness greater than the first roughness, and the second lower surface may overlap with an upper surface of the organic insulation pattern in a thickness direction.

The second lower surface of the first curable pattern and the upper surface of the organic insulation pattern may include a scratch.

The signal wirings may be connected directly to the lead wirings.

The signal wirings may be configured to be bonded to the lead wirings by ultrasonic bonding.

A method of fabricating a display device according to another exemplary embodiment includes the steps of applying a first curing resin having a surface height less than a surface height of lead wirings disposed on a base film between adjacent ones of the lead wirings, curing the applied first curing resin to form a first curable pattern, and coupling signal wirings disposed on a display substrate with the lead wirings.

The step of coupling the signal wirings with the lead wirings may include bringing the signal wirings into direct contact with the lead wirings.

The step of bringing the signal wirings to the lead wirings comprises ultrasonically bonding the signal wirings with the lead wirings.

The step of curing the applied first curing resin comprises forming the first curable pattern using a UV laser.

The method may further include the step of applying a second curable resin after the signal wirings disposed on the display substrate are coupled with the lead wirings.

The method may further include curing the first curable pattern and the second curing resin simultaneously after the applying the second curing resin.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
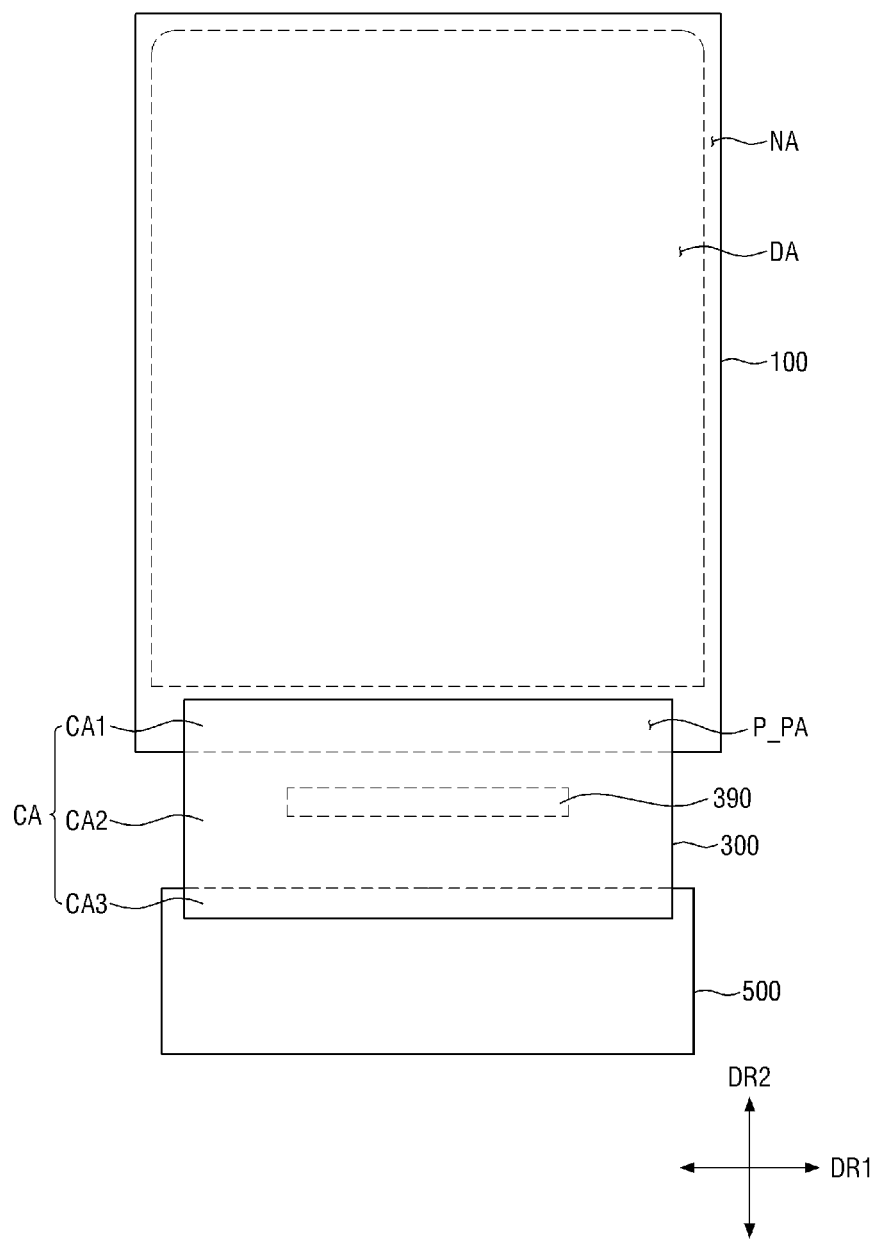
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
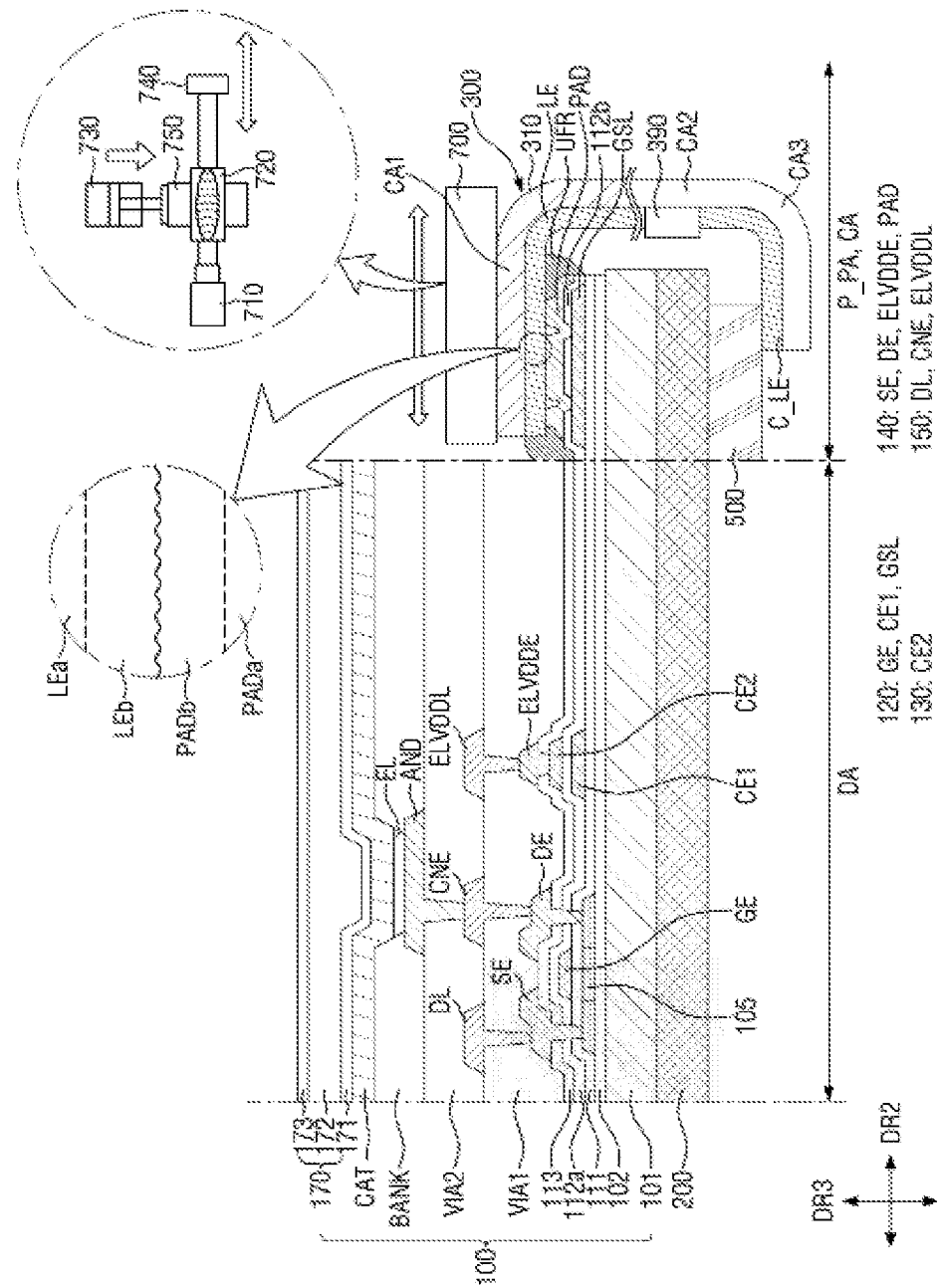
FIG. 2 is a cross-sectional view of the display device of FIG. 1.
Figure 3:
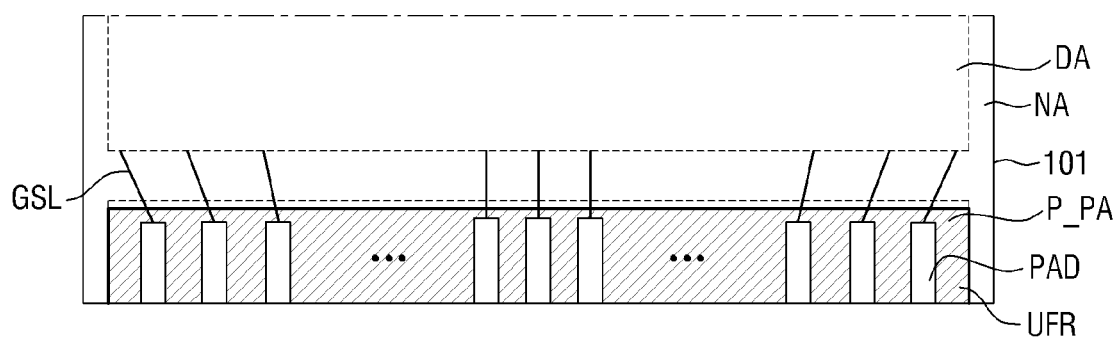
FIG. 3 is a layout of a pad area and a layout of a part of a printed circuit board when viewed from the top.
Figure 3:
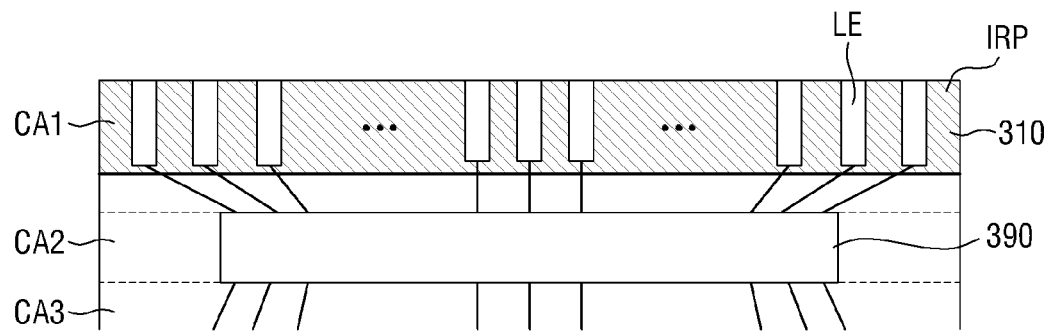
Figure 3:
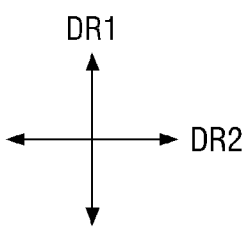
Figure 4:
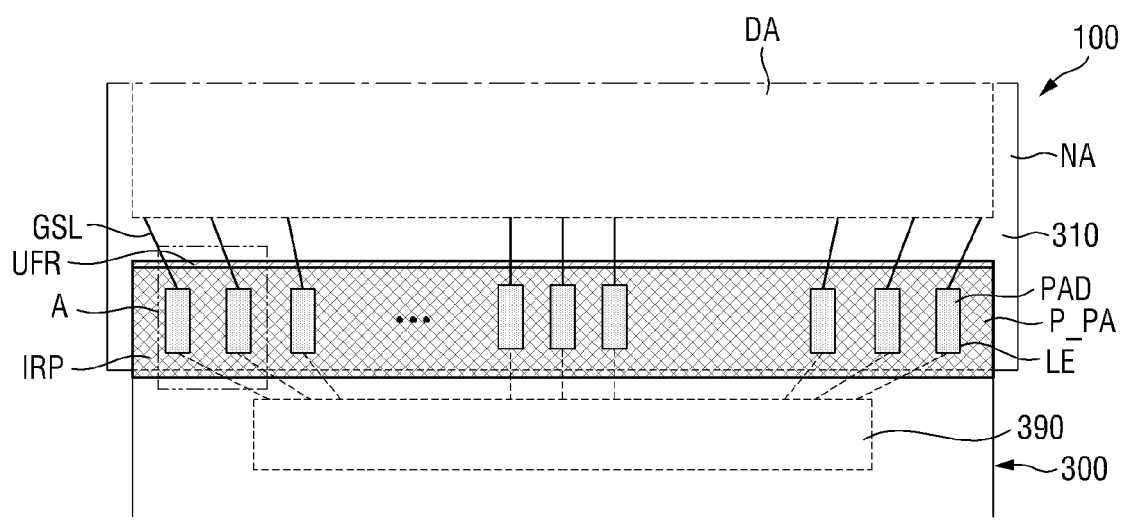
FIG. 4 is a plan view of a layout of a pad area of a display panel and a printed circuit board attached to the pad area.
Figure 4:
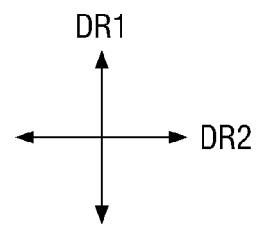
Figure 5:
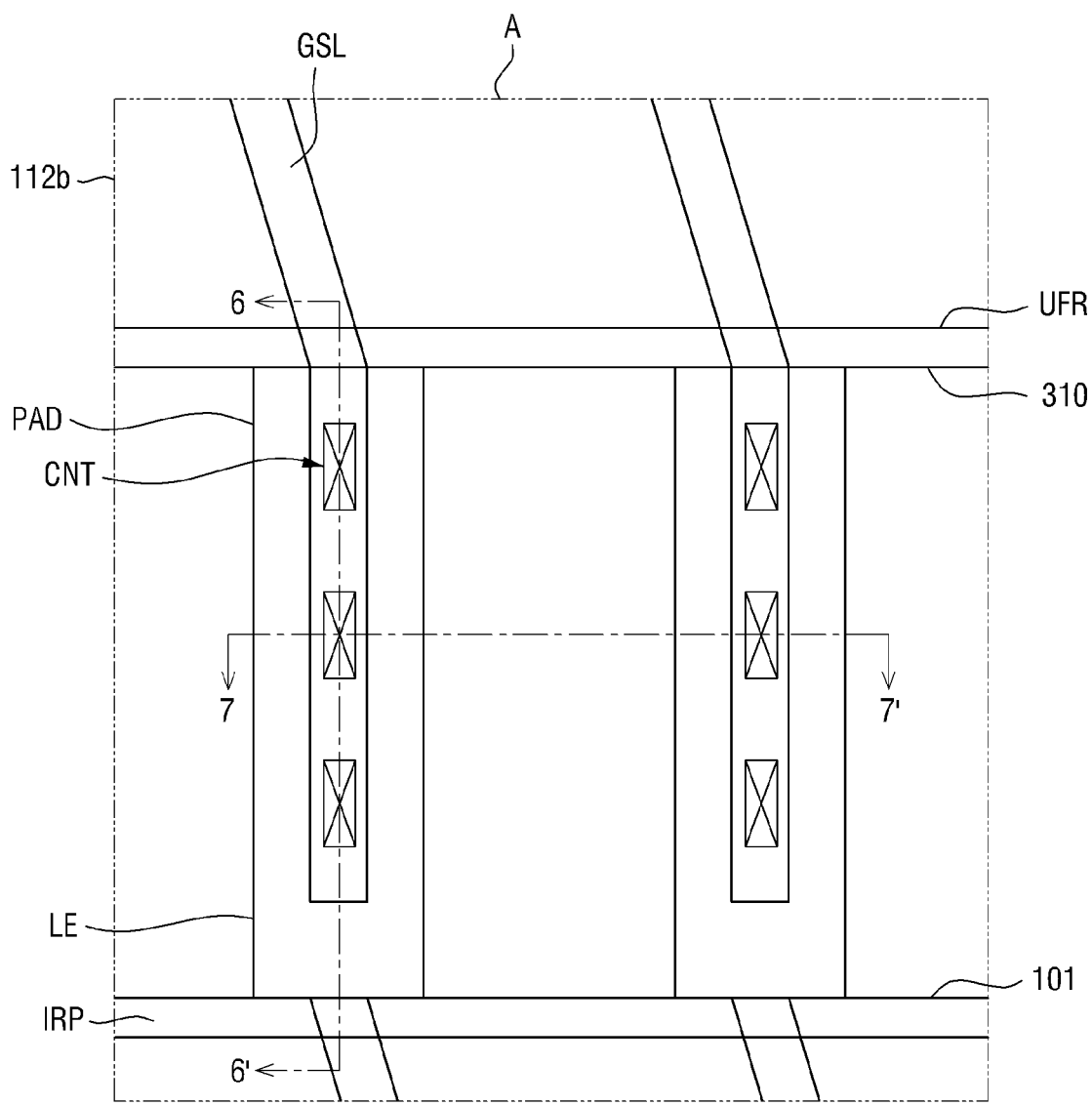
FIG. 5 is an enlarged view of area A of FIG. 4.
Figure 5:
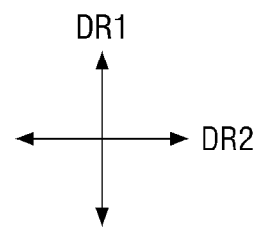
Figure 6:
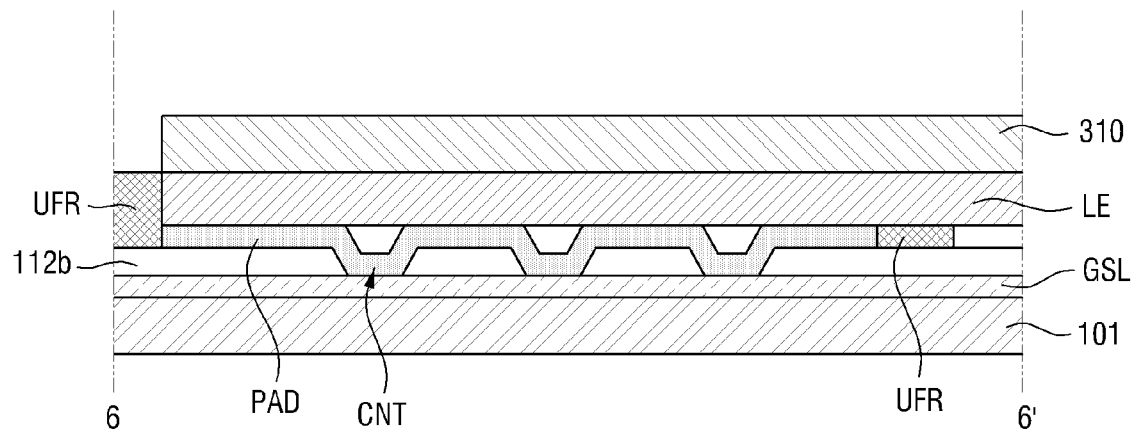
FIG. 6 is a cross-sectional view taken along line VI-VI' of FIG. 5.
Figure 7:
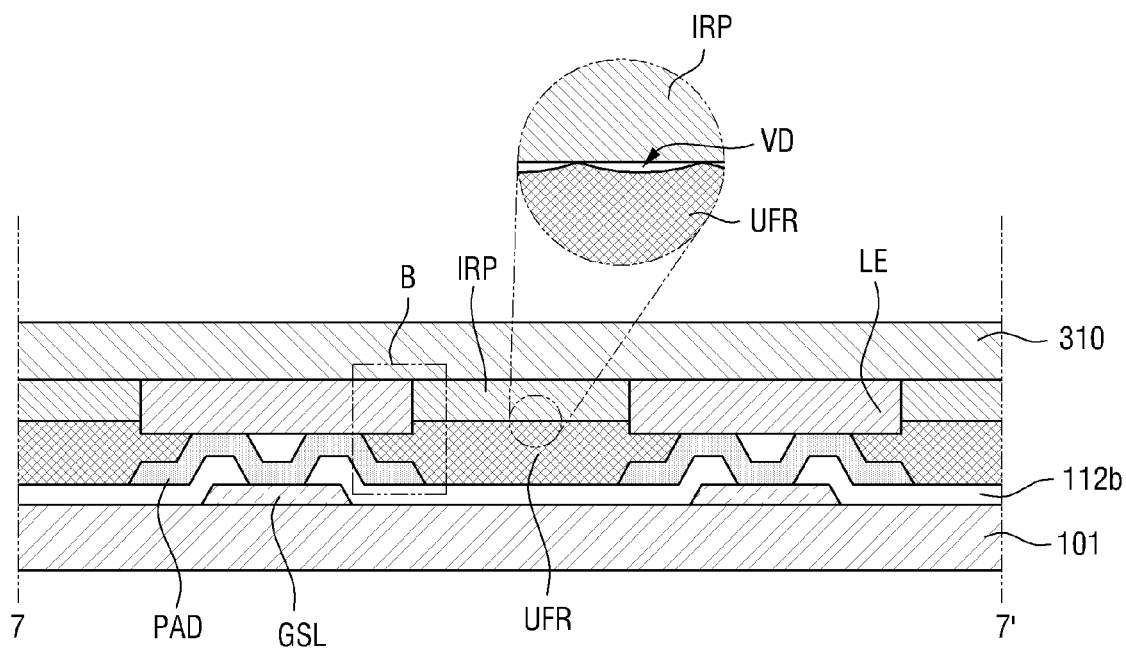
FIG. 7 is a cross-sectional view taken along line VII-VII' of FIG. 5.
Figure 8:
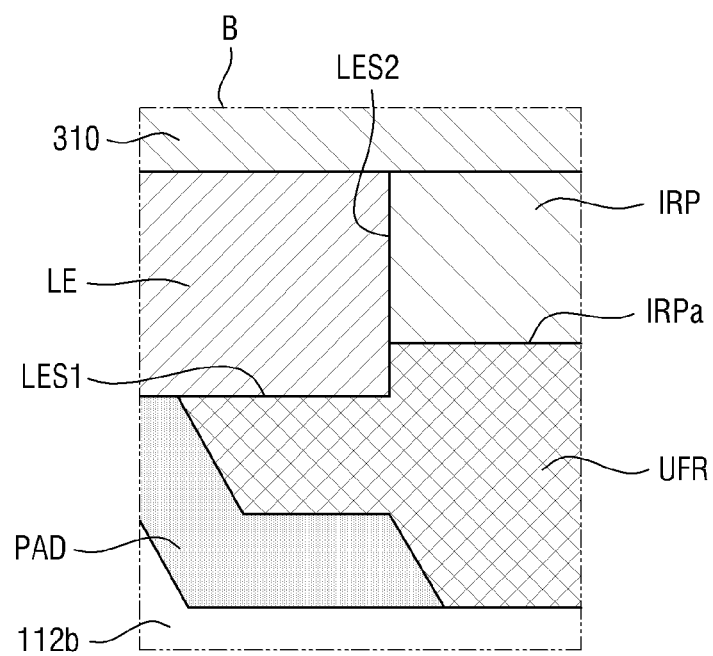
FIG. 8 is an enlarged view of area B of FIG. 7.

FIG. 1 is a plan view of a display device according to an exemplary embodiment. FIG. 2 is a cross-sectional view of the display device of FIG. 1. FIG. 3 is a layout of a pad area and a layout of a part of a printed circuit board when viewed from the top. FIG. 4 is a plan view of a layout of a pad area of a display panel and a printed circuit board attached to the pad area. FIG. 5 is an enlarged view of area A shown in FIG. 4. FIG. 6 is a cross-sectional view taken along line VI-VI' of FIG. 5. FIG. 7 is a cross-sectional view taken along line VII-VII' of FIG. 5. FIG. 8 is an enlarged view of area B of FIG. 7.

Display devices display moving images or still images. A display device may be used as the display screen of portable electronic devices, such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products, such as a television, a notebook, a monitor, a billboard and the Internet of Things.

Referring to FIGS. 1 to 8, a display device 1 may include a display panel 100 for displaying images, a printed circuit board 300 connected to the display panel 100, and a main circuit board 500 connected to the printed circuit board 300.

For example, an organic light-emitting display panel may be employed as the display panel 100. Hereinafter, the display panel 100 will be described with reference to an organic light-emitting display panel. However, the inventive concepts are not limited thereto, and in some exemplary embodiments, other types of display panels, such as a liquid-crystal display (LCD) panel, a quantum-dot organic light-emitting display (QD-OLED) panel, a quantum-dot liquid-crystal display (QD-LCD) panel, a quantum-nano light-emitting display (Nano NED) panel, a micro LED panel, or the like, may be used as the display panel 100.

The display panel 100 includes a display area DA, where a plurality of pixel areas is disposed, and a non-display area NA disposed around the display area DA. The display area DA may have substantially a rectangular shape having corners at the right angle or rounded corners when viewed from the top. The display area DA may include shorter sides and longer sides. The shorter sides of the display area DA may be extended in a first direction DR1. The longer sides of the display area DA may be extended in a second direction DR2. However, the inventive concepts are not limited thereto. For example, the display area DA may have substantially a circular or an elliptical shape. In addition, the non-display area NA may be disposed adjacent to the two shorter sides and the two longer sides of the display area DA. In this case, the display area NA may surround each side of the display area DA, and may form the edges of the display area DA. In some exemplary embodiments, however, the non-display area NA may be disposed adjacent only to the two shorter sides or only to the two longer sides of the display area DA.

The non-display area NA of the display panel 100 further includes a panel pad area P_PA. The panel pad area P_PA may be disposed, for example, around one shorter side of the display area DA, however, the inventive concepts are not limited thereto. In some exemplary embodiments, the panel pad area P_PA may be disposed around each of the two shorter sides of the display area DA, or around each of the shorter sides and the longer sides of the display area DA.

The printed circuit board 300 may include a printed base film 310 (or base film) and a driver integrated circuit 390 disposed on the printed base film 310. The printed base film 310 may include an insulating material.

The printed circuit board 300 may include a first circuit area CA1 having one side attached to the panel pad area P_PA of the display panel 100, a second circuit area CA2 disposed on one side of the first circuit area CA1 in the second direction DR2, and a third circuit area CA3 disposed on one side of the second circuit area CA2 in the second direction DR2 and attached to the main circuit board 500. The driver integrated circuit 390 may be disposed on the second circuit area CA2 of the printed circuit board 300. The driver integrated circuit 390 may be a data driver integrated circuit, for example, and may be implemented by using chip-on-film (COF) technology.

The main circuit board 500 may include a circuit pad area attached to the third circuit area CA3 of the printed circuit board 300. A plurality of circuit pads may be disposed in the circuit pad area of the main circuit board 500, and connected to lead wirings disposed in the third circuit area CA3 of the printed circuit board 300.

Referring to FIG. 2, the display device 1 may further include a cover panel sheet 200 disposed under the display panel 100. The cover panel sheet 200 may be attached to the rear surface of the display panel 100. The cover panel sheet 200 includes at least one functional layer. The functional layer may perform a heat dissipation function, an electromagnetic wave shielding function, a grounding function, a buffering function, a strength enhancing function, a supporting function, and/or a digitizing function. The functional layer may be a sheet layer made of a sheet, a film layer made of a film, a thin film layer, a coating layer, a panel, a plate, etc. The functional layer may include a single layer or a plurality of thin films or coating layers stacked on one another. The functional layer may be, for example, a supporting substrate, a heat-radiating layer, an electromagnetic wave shielding layer, a shock absorbing layer, a digitizer, etc.

The printed circuit board 300 may be bent downward in a third direction DR3, as shown in FIG. 2. In this case, the other side of the printed circuit board 300 and the main circuit board 500 may be positioned below the cover panel sheet 200. The lower surface of the cover panel sheet 200 may be bonded with the main circuit board 500 by an adhesive layer, without being limited thereto.

The display panel 100 may include a display substrate 101, a plurality of conductive layers, a plurality of insulating layers for insulating the conductive layers, an organic layer EL, etc.

The display substrate 101 is extended over the entire display area DA and the non-display area NA. The display substrate 101 may support various elements disposed thereon. In an exemplary embodiment, the display substrate 101 may be a rigid substrate including a rigid material, such as flexible glass and quartz. However, the inventive concepts are not limited thereto. For example, in some exemplary embodiments, the display substrate 101 may be a flexible substrate including a flexible material, such as polyimide (PI).

A buffer layer 102 may be disposed on the display substrate 101. The buffer layer 102 may prevent moisture and oxygen from permeating from the outside through the display substrate 101. The buffer layer 102 may include one of a silicon nitride ($SiN_x$) layer, a silicon oxide ($SiO_2$) layer, and a silicon oxynitride ($SiO_xN_y$) layer.

A semiconductor layer 105 may be disposed on the buffer layer 102. The semiconductor layer 105 forms a channel of a thin-film transistor. The semiconductor layer 105 is disposed in each pixel of the display area DA, and may be disposed in the non-display area NA in some exemplary implementations. The semiconductor layer 105 may include source/drain regions and an active region. The semiconductor layer 105 may include polycrystalline silicon.

A first insulating layer 111 may be disposed on the semiconductor layer 105. The first insulating layer 111 may be disposed on the entire surface of the display substrate 101. The first insulating layer 111 may be a gate insulating layer having a gate insulating function. The first insulating layer 111 may include a silicon compound, a metal oxide, etc. For example, the first insulating layer 111 may include at least one or more of silicon oxide, silicon nitride, silicon oxynitride, aluminum oxide, tantalum oxide, hafnium oxide, zirconium oxide, titanium oxide, etc.

A first conductive layer 120 may be disposed on the first insulating layer 111. The first conductive layer 120 may include a gate electrode GE of a thin-film transistor TFT, a first electrode CE1 of a storage capacitor Cst, and a gate signal line GSL. The gate signal line GSL may be disposed across the display area DA and the panel pad area P_PA. The first conductive layer 120 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may have a single layer or multiple layers structure.

Second insulating layers 112a and 112b may be disposed on the first conductive layer 120. The second insulating layers 112a and 112b may insulate the first conductive layer 120 from the second conductive layer 130. The second insulating layer 112a may be disposed substantially in the display area DA while the second insulating layer 112b may be disposed substantially in the panel pad area P_PA. The second insulating layers 112a and 112b may include materials that may form the first insulating layer 111 described above. In the panel pad area P_PA, the second insulating layer 112b may include a plurality of contact holes CNT partially exposing the gate signal line GSL. Although the second insulating layer 112b is illustrated as including two contact holes CNT in FIG. 2, however, the inventive concepts are not limited thereto. In some exemplary embodiments, the second insulating layer 112b may include three or more contact holes CNT.

The second conductive layer 130 may be disposed on the second insulating layers 112a and 112b. The second conductive layer 130 may include a second electrode CE2 of the storage capacitor Cst. The material of the second conductive layer 130 may be selected from that may form the first conductive layer 120 described above. The first electrode CE1 of the storage capacitor Cst and the second electrode CE2 of the storage capacitor Cst may form a capacitor through the second insulating layers 112a and 112b.

The third insulating layer 113 may be disposed on the second conductive layer 130. The third insulating layer 113 may include at least one material that may form the first insulating layer 111 described above. In some exemplary embodiments, the third insulating layer 113 may include an organic insulating material. The organic insulating material may be selected from that may form a first via layer VIA1, which will be described in more detail later.

A third conductive layer 140 may be disposed on the third insulating layer 113. The third conductive layer 140 may include a source electrode SE, a drain electrode DE, a high supply voltage electrode ELVDDE, and a signal line PAD. The third conductive layer 140 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 140 may have a single layer or multiple layers structure. For example, the third conductive layer 140 may have a stack structure of Ti/Al/Ti, Mo/Al/Mo, Mo/AlGe/Mo, Ti/Cu, etc. In some exemplary embodiments, the third conductive layer 140 may include Ti/Al/Ti.

The signal line PAD of the third conductive layer 140 may overlap with the gate signal line GSL of the first conductive layer 120 in the thickness direction, and may be electrically connected to the gate signal line GSL through the contact holes CNT of the second insulating layer 112b.

The first via layer VIA1 may be disposed on the third conductive layer 140. The first via layer VIA1 may include an organic insulating material. The organic insulating material may include at least one of polyacrylate resin, epoxy resin, phenolic resin, polyamide resin, polyimide resin, unsaturated polyesters resin, polyphenylene ether resin, polyphenylene sulfide resin, benzocyclobutene (BCB), etc.

At least some of the elements disposed on the third insulating layer 113 and the third conductive layer 140 in the display area DA may be omitted in some parts of the signal line PAD on the panel pad area P_PA. In this manner, the signal line PAD disposed in the panel pad area P_PA may be exposed.

The printed circuit board 300 further includes a lead line LE on one surface of the first circuit area CA1 of the printed base film 310, and a circuit lead line C_LE on one surface of the third circuit area CA3. The lead line LE is connected to the signal line PAD. According to the illustrated exemplary embodiment, the lead line LE may be connected directly to the upper surface of the exposed signal line PAD. For example, the lead line LE may be connected to the signal line PAD by ultrasonic bonding.

The ultrasonic bonding may be performed by an ultrasonic apparatus 700. The ultrasonic apparatus 700 may include a vibration generator 710, a vibrator 720 connected to the vibration generator 710, a presser 730 for amplifying the vibration amplitude of the vibrator 720, and a vibration transferer 740 connected to the vibrator 720.

The vibration generator 710 can convert electrical energy into vibrational energy. The vibrator 720 can vibrate with the vibrational energy converted by the vibration generator 710. The vibrator 720 can vibrate with an amplitude in a vibration direction. The amplitude of the vibrator 720 may be amplified in the direction parallel to the vibration direction by the presser 730 connected to the vibrator 720. The vibration transferer 740 can transfer the vibration of the vibrator 720 to an object to be bonded by the ultrasonic bonding. A supporter 750 fixes the upper surface and the lower surface of the vibrator 720 in order to restrict the vibrator 720 and the vibration transferer 740 from fluctuating up and down by the vibration.

In an exemplary embodiment, the ultrasonic apparatus 700 may be in contact with the other surface of the printed circuit board 300 to apply a constant pressure in a downward direction, so that the vibration transferer 740 can efficiently transfer the vibration to the printed circuit board 300. The ultrasonic bonding may be performed as the vibration transferer 740 of the ultrasonic apparatus 700 overlaps with the printed circuit board 300 disposed thereunder, as shown in FIG. 2.

The ultrasonic apparatus 700 may vibrate in the vibration direction to vibrate the lead line LE in the vibration direction. As such, the signal line PAD may vibrate in the vibration direction by the vibration transmitted through the lead line LE. In this case, the amplitude of the vibration may be ignorable. Accordingly, the amplitude of the vibration transferer 740 in the vibration direction may be substantially equal to the distance by which the lead line LE has moved on the signal line PAD in the vibration direction. In an exemplary embodiment, the vibration direction may be the second direction DR2. In other words, the vibration direction may be a direction in which the longer sides of the signal line PAD and the lead line LE extend.

When the lead line LE is ultrasonically vibrated on the surface of the signal line PAD, a frictional force is generated at the interface between the signal line PAD and the lead line LE, such that frictional heat may be generated due to the frictional force. When the frictional heat is high enough to melt the materials of the signal line PAD and the lead line LE, a melting region PADb of the signal line PAD adjacent to the lead line LE and a melting region LEb of the lead line LE adjacent to the signal line PAD may be melted. In this manner, the signal line PAD may include a non-melting region PADa and the melting region PADb. Likewise, the lead line LE may include a non-melting region LEa and the melting region LEb.

The non-melting region PADa may include only the material included in the signal line PAD. The non-melting region LEa may include only the material included in the lead line LE.

The material included in the lead line LE may be diffused into the melting region PADb, so that the material of the signal line PAD and the material of the lead line LE may be mixed. The material included in the signal line PAD may be diffused into the melting region LEb, so that the material of the lead line LE and the material of the signal line PAD may be mixed.

In the melting region PADb and the melting region LEb, the signal wirings PAD and the lead line LE are solidified to be bonded with each other. The interface between the signal line PAD and the lead line LE, i.e., the interface between the melting region PADb and the melting region LEb, may have a non-flat shape.

For example, the lead line LE may include metal. The lead line LE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an exemplary embodiment, the lead line LE may include copper (Cu) and gold (Au). More particularly, the lead line LE may include copper (Cu) disposed on the printed base film 310, and gold (Au) disposed on the copper (Cu). The copper (Cu) disposed directly on the printed base film 310 may not be connected directly to the signal line PAD, without being limited thereto. In some exemplary embodiments, a part of the signal line PAD may be connected directly to copper (Cu) disposed on the printed base film 310. In addition, the gold (Au) disposed on the copper (Cu) may be connected directly to the signal line PAD. In this case, Ti/Al/Ti of the signal line PAD may be mixed with gold (Au) and/or copper (Cu) of the lead line LE in the melting region PADb, and the material contained in the signal line PAD may be diffused, such that the gold (Au) and/or copper (Cu) of the lead line LE may be mixed with Ti/Al/Ti of the signal line PAD in the melting region LEb.

In order to bond the signal line PAD with the lead line LE, the vibration transferer 740 of the ultrasonic apparatus 700 presses the upper surface of the printed base film 310 of the printed circuit board 300 in the third direction DR3, and applies the vibration in the second direction DR2, as described above. In this manner, the lead line LE disposed on the printed base film 310 is bonded to the signal line PAD as described above. After the ultrasonic bonding process is completed, the vibration transferer 740 of the ultrasonic apparatus 700 is separated from the printed base film 310 in the thickness direction DR3. In this case, when coupling force between the signal line PAD and the lead line LE is greater than the coupling force between the lead line LE and the printed base film 310, the lead line LE may be peeled off from the printed base film 310, which may cause a crack in the lead line LE. As such, according to an exemplary embodiment, a first curable pattern IRP is disposed between adjacent lead wirings LE in the display device 1, which will be described in more detail later, which may prevent the lead line LE from being peeled off from the printed base film 310.

A fourth conductive layer 150 may be disposed on the first via layer VIA1. The fourth conductive layer 150 may include a data line DL, a connection electrode CNE, and a high supply voltage line ELVDDL. The data line DL may be electrically connected to the source electrode SE of the thin-film transistor TFT through a contact hole penetrating through the first via layer VIA1. The connection electrode CNE may be electrically connected to the drain electrode DE of the thin-film transistor TFT through a contact hole penetrating through the first via layer VIA1. The high supply voltage line ELVDDL may be electrically connected to the high supply voltage electrode ELVDDE through a contact hole penetrating through the first via layer VIA1. The fourth conductive layer 150 may include a material that may form the third conductive layer 140 described above.

A second via layer VIA2 is disposed on the fourth conductive layer 150. The second via layer VIA2 may include a material that may form the first via layer VIA1 described above.

An anode electrode AND is disposed on the second via layer VIA2. The anode electrode AND may be electrically connected to the connection electrode CNE through a contact hole penetrating through the second via layer VIA2.

A bank layer BANK may be disposed on the anode electrode AND. The bank layer BANK may include a contact hole through which the anode electrode AND is exposed. The bank layer BANK may include an organic insulating material or an inorganic insulating material. For example, the bank layer BANK may include at least one of a photoresist, a polyimide resin, an acrylic resin, a silicon compound, a polyacrylic resin, and the like.

An organic layer EL may be disposed on the upper surface of the anode electrode AND and the opening of the bank layer BANK. A cathode electrode CAT is disposed on the organic layer EL and the bank layer BANK. The cathode electrode CAT may be a common electrode disposed over a plurality of pixels.

A thin-film encapsulation layer 170 is disposed on the cathode electrode CAT. The thin-film encapsulation layer 170 may cover an organic light-emitting diode OLED. The thin-film encapsulation layer 170 may include a stack of inorganic layers and organic layers alternately disposed on one over another. For example, the thin-film encapsulation layer 170 may include a first inorganic encapsulation layer 171, an organic encapsulation layer 173, and a second inorganic encapsulation layer 175 sequentially stacked one over another.

The stacked structure and the shape of the gate signal line GSL and the signal line PAD in the panel pad area P_PA are not limited to those shown in the drawings, and may be modified.

For example, in some exemplary embodiments, the gate signal line GSL may include a plurality of patterns, and the signal line PAD disposed on the gate signal line GSL may have surface irregularities reflecting a step difference of the gate signal line GSL.

In some exemplary embodiments, an auxiliary pad of the second conductive layer 130 may be further disposed between the gate signal line GSL and the signal line PAD. In this case, the size of the auxiliary pad may be less than the size of the signal line PAD when viewed from the top. The signal line PAD, the auxiliary pad, and the gate signal line GSL may overlap with one another in the thickness direction, and may be electrically connected to one another.

In some exemplary embodiments, the gate signal line GSL may be formed as the second conductive layer 130, and the signal line PAD may be formed as the fourth conductive layer 150.

Referring to FIG. 3, a plurality of signal lines (hereinafter, may also be referred to as signal wirings) PAD may be arranged along the first direction DR1. The plurality of signal wirings PAD may include, for example, a power supply pad, a data pad, and a panel dummy pad. The first direction DR1 may extend from one end of the panel pad area P_PA toward the display area DA. The second direction DR2 may refer to a direction intersecting the first direction DR2. The plurality of signal wirings PAD may have a greater width than that of the gate signal wirings GSL in the second direction DR2. The plurality of signal wirings PAD may be extended to the end of the display substrate 101 with the expanded width.

In addition, a plurality of the lead wirings LE may be disposed in the first circuit area CA1, and may be arranged along the first direction DR1. The plurality of lead wirings LE may include a power lead line, a data lead line, and a dummy lead. The plurality of lead wirings LE may be extended from the driver integrated circuit 390 and may have a width expanded in the second direction DR2 in the first circuit area CA1. Accordingly, the lead wirings LE can have increased connection area, and thus, can be more easily connected to the signal wirings PAD as shown in FIG. 4. The plurality of lead wirings LE may be extended to the end of the printed base film 310 with the expanded with.

The lead wirings LE with the expanded width may have substantially a rectangular shape. More particularly, the lead wirings LE having the expanded width may include shorter side edges and longer side edges.

The first curable pattern IRP may be formed around the lead wirings LE when viewed from the top. The first curable pattern IRP may be disposed between adjacent lead wirings LE. The first curable pattern IRP may be extended to the end of the first circuit area CA1 of the printed base film 310. The first curable pattern IRP may surround the longer side edges of the lead wirings LE and the shorter side edge adjacent to the driver integrated circuit 390, but may not surround the upper shorter side edge of the lead wirings LE when viewed from the top.

The first curable pattern IRP may include a curable resin. The first curable pattern IRP may have a first average curing rate.

A second curable pattern UFR may be formed around the signal wirings PAD when viewed from the top. The second curable pattern UFR may be disposed between adjacent signal wirings PAD. The second curable pattern UFR may be expanded to the end of the panel pad area P_PA of the display substrate 101. The second curable pattern UFR may surround the longer side edges of the signal wirings PAD and the shorter side edge adjacent to the display area DA, but may not surround the lower shorter side edge of the signal wirings PAD when viewed from the top.

The second curable pattern UFR may include a curable resin. The second curable pattern UFR may have a second average curing rate lower than the first average curing rate of the first curable pattern IRP.

Referring to FIG. 4, the signal wirings PAD may be connected to the lead wirings LE, respectively. According to the illustrated exemplary embodiment, the signal wirings PAD and the lead wirings LE have substantially the same width. However, the inventive concepts are not limited thereto, and in some exemplary embodiments, the signal wirings PAD and the lead wirings LE may have different widths in second direction DR2. In particular, the width of the lead wirings LE may be less than the width of the signal wirings PAD in the second direction DR2. The signal wirings PAD may be connected directly to the lead wirings LE and may be ultrasonically bonded. The first circuit area CA1 of FIG. 3 rotated by 180 degrees is attached to the panel pad area P_PA of FIG. 3 in the thickness direction. The second curable pattern UFR may be formed around the lead wirings LE when viewed from the top. The second curable pattern UFR may be disposed between adjacent lead wirings LE. The second curable pattern UFR may be extended to the end of the first circuit area CA1 of the printed base film 310. As described above with reference to FIG. 3, the first curable pattern IRP may surround the longer side edges of the lead wirings LE and the upper shorter side edge thereof, but may not surround the lower shorter side edge adjacent to the driver integrated circuit 390 when viewed from the top.

The first curable pattern IRP is formed in the form of a first curable pattern IRP2 (see FIG. 16) on the printed circuit board 300 before the ultrasonic bonding process is performed on the signal line PAD and the lead line LE. However, the second curable pattern UFR is formed on the printed circuit board 300 and the display panel 100 after the ultrasonic bonding process. Accordingly, the first curable pattern IRP is not disposed on the upper side of the end of the printed base film 310, e.g., on the upper side in the first direction DR1, while the second curable pattern UFR may be further expanded toward the upper side of the end of the printed base film 310 than the first curable pattern IRP. In particular, the second curable pattern UFR may be expanded to be closer to the display area DA than the first curable pattern IRP.

Referring to FIG. 5, the gate signal line GSL may be disposed from the display area DA to the panel pad area P_PA, and may have an expanded width in the second direction DR2 at least in a portion of the gate signal line GSL overlapping with the signal line PAD of the panel pad area P_PA.

The second insulating layer 112b may include a plurality of contact holes CNT connecting the signal wirings PAD with the gate signal wirings GSL thereunder. Although FIG. 5 shows three contact holes CNT arranged in one row and spaced apart from one another in the first direction DR1, the inventive concepts are not limited to a particular number and arrangement of the contact holes CNT. In some exemplary embodiments, one, two, or four or more contact holes CNT may be arranged in a plurality of rows.

Referring to FIG. 6, the second curable pattern UFR may be disposed on a part of the second insulating layer 112b, on which the signal line PAD is not disposed, and may be in direct contact with the second insulating layer 112b. The second curable pattern UFR may overlap with the gate signal line GSL disposed thereunder in the thickness direction on the part of the second insulating layer 112b.

The second curable pattern UFR disposed adjacent to the upper short side of the signal line PAD may be in contact with the side surface of the signal line PAD and the side surface of the lead line LE, as shown in FIG. 6. The second curable pattern UFR may also be in contact with the side surface of the printed base film 310. In addition, the second curable pattern UFR disposed adjacent to the lower shorter side of the signal line PAD in FIG. 5 may overlap with the upper lead line LE in the thickness direction.

Referring to FIG. 7, the second curable pattern UFR may be in contact with a part of the lower surface of each of the lead wirings LE that faces the upper surface of the signal wirings PAD, and with a part of the side surface of each of the lead wirings LE. The second curable pattern UFR may be in contact with and may overlap with the first curable pattern IRP in the thickness direction. The second curable pattern UFR may be disposed between adjacent signal wirings PAD.

The first curable pattern IRP may be disposed on the printed base film 310. The first curable pattern IRP may be disposed between adjacent lead wirings LE. The first curable pattern IRP may be in contact with a part of the lower surface of the printed base film 310 exposed between the lead wirings LE. The first curable pattern IRP may overlap with the second curable pattern UFR disposed thereunder. A part of the first curable pattern IRP may be in contact with the second curable pattern UFR disposed thereunder, and the other part thereof may not be in contact with the second curable pattern UFR. As shown in the enlarged circle of FIG. 7, the lower surface of the first curable pattern IRP is in contact with the upper surface of the second curable pattern UFR disposed thereunder, while there may be voids therebetween, such that the lower surface of the first curable pattern IRP may be partially spaced apart from the upper surface of the second curable pattern UFR.

The first curable pattern IRP may not overlap with the signal line PAD and the gate signal line GSL. However, when the width of the lead line LE in the second direction DR2 is less than the width of the signal line PAD in the second direction DR2 as described above, the first curable pattern IRP may partially overlap with the signal line PAD thereunder.

Referring to FIG. 8, the lead line LE may include a lower surface LES1 facing the upper surface of the signal line PAD, and a side surface LES2. The first curable pattern IRP may include a lower surface IRPa facing the second curable pattern UFR. The second curable pattern UFR may be in contact with a part of the lower surface LES1 and a part of the side surface LES2 of the lead line LE. In addition, at least a part of the second curable pattern UFR may be in contact with the lower surface IRPa of the first curable pattern IRP. The surface height of the first curable pattern IRP from the printed base film 310 may be less than the surface height of the lead line LE from the printed base film 310. In this case, the first curable pattern IRP may be in contact with the side surface LES2 of the lead line LE exposed by the second curable pattern UFR.

In some exemplary embodiments, the first curable pattern IRP may completely cover the side surface LES2 of the lead line LE. In particular, the surface height of the first curable pattern IRP may be substantially the same as the surface height of the lead line LE from the printed base film 310. In this case, the second curable pattern UFR may be in contact with the lower surface LES1 of the lead line LE but not with the side surface LES2 of the lead line LE.

Figure 9:
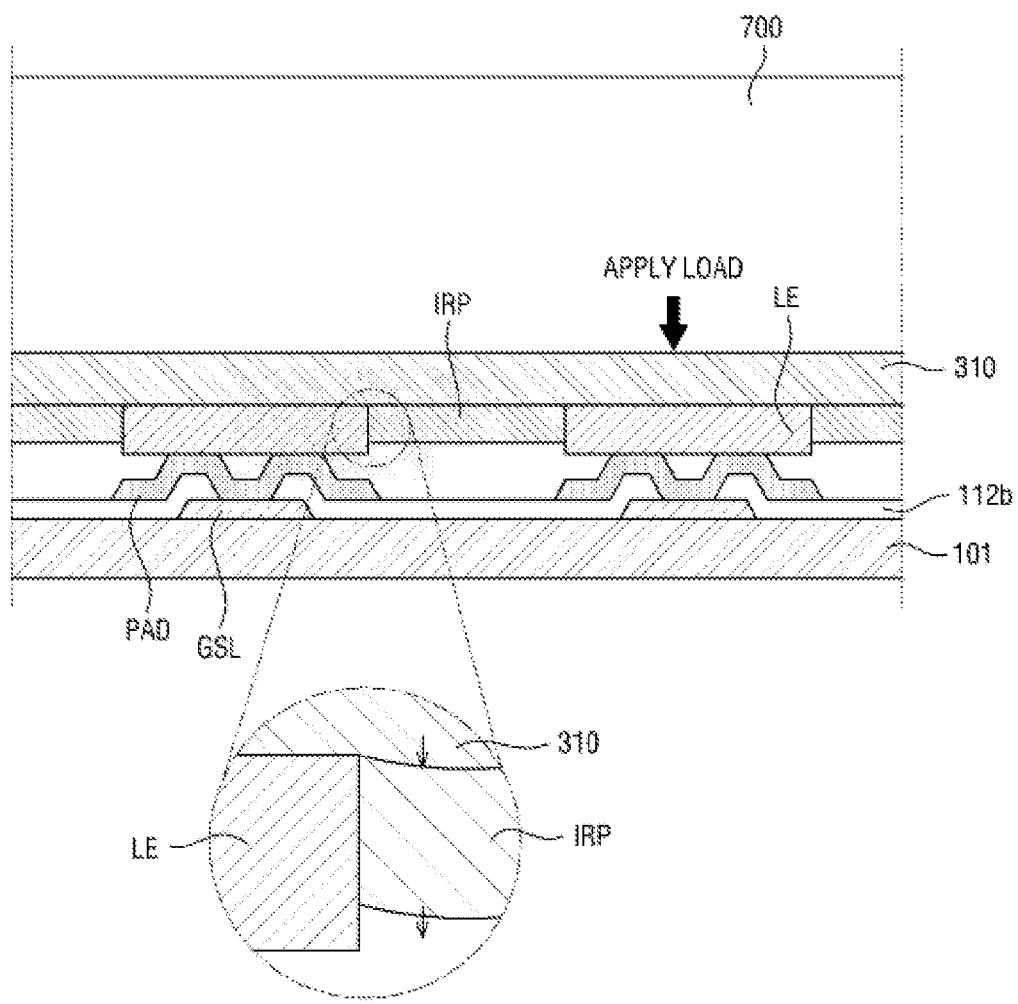
FIG. 9 is a cross-sectional view illustrating an ultrasonic bonding process, in which the vibration transferer of an ultrasonic apparatus applies a load to a printed circuit board.
Figure 10:
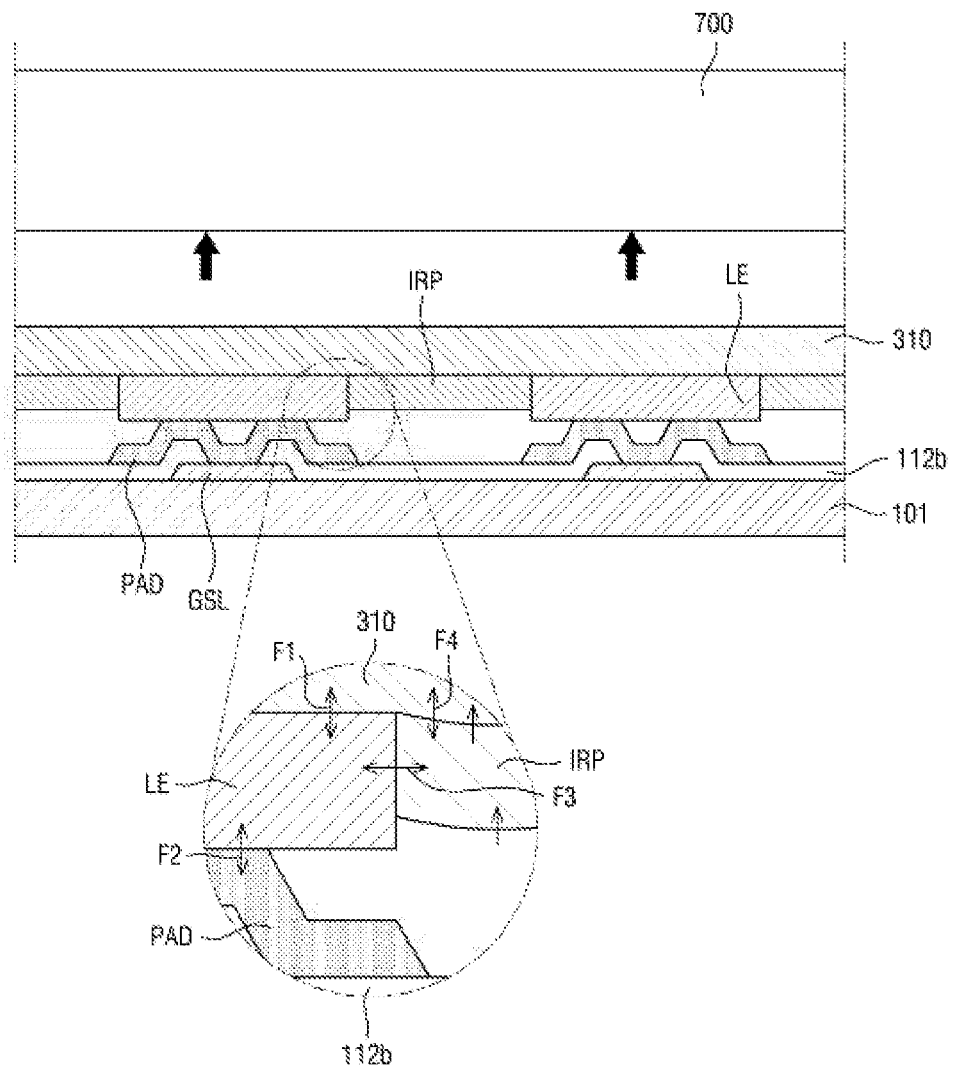
FIG. 10 is a cross-sectional view illustrating an ultrasonic bonding process, in which the vibration transferer of an ultrasonic apparatus is separated from a printed circuit board.

Referring to FIGS. 2, 9 and 10, by applying the vibration and load to the printed circuit board 300 downwardly through the vibration transferer 740 of the ultrasonic apparatus 700, the printed base film 310 and the lead wirings LE may be lowered downward. As described above, the lead wirings LE may be connected directly to the signal wirings PAD, respectively. After the ultrasonic bonding process is completed, the vibration transferer 740 of the ultrasonic apparatus 700 is separated from the upper surface of the printed base film 310, such that the printed base film 310 and the lead wirings LE may be raised back to their previous positions. As a result of the ultrasonic bonding, a second coupling force F2 between the signal line PAD and the lead line LE may be greater than a first coupling force F1 between the lead line LE and the printed base film 310. As such, the lead wirings LE may be peeled off from the printed base film 310.

In view of the above, according to an exemplary embodiment, the first curable pattern IRP is disposed between adjacent lead wirings LE in the display device 1, and thus, it is possible to prevent the lead line LE from being peeled off from the printed base film 310. More particularly, as shown in FIG. 10, the first curable pattern IRP is bonded with the adjacent lead line LE with a third coupling force F3, and is bonded with the printed base film 310 with a fourth coupling force F4, such that the lead line LE is attached to the printed base film 310 by the sum of the third and fourth coupling forces F3 and F4. In this manner, even if the second coupling force F2 is greater than the first coupling force F1, the added force can substantially cancel the difference between the first and second coupling forces F1 and F2. As such, even if the printed base film 310 and the lead wirings LE are raised back to their previous positions after the ultrasonic bonding process is completed, it is possible to prevent the lead wirings LE from being peeled off from the printed base film 310.

The first curable pattern IRP may include a material having a high coupling force with each of the lead line LE and the printed base film 310, respectively, in order to increase the third and fourth coupling forces F3 and F4.

In addition, when the printed base film 310 and the lead wirings LE are raised after the ultrasonic bonding process is completed, the deformation rate of the printed base film 310 in the thickness direction may be greater in a portion where the lead wirings LE are not disposed than a portion where the lead wirings LE are disposed. As such, according to an exemplary embodiment, the first curable pattern IRP has a surface height lower than the lead wirings LE, and is spaced apart from the display substrate 101 disposed thereunder, but the first curable pattern IRP includes a material having a higher curing rate than the second curable pattern UFR described above. Accordingly, it is possible to reduce the deformation rate of the printed base film 310 where the lead wirings LE are not disposed. In this manner, it is possible to prevent the edges of the lead wirings LE from being peeled off from the printed base film 310 due to the larger deformation rate of the printed base film 310 where the lead wirings LE are not disposed.

Hereinafter, display devices according to other exemplary embodiments will be described. In the following description, the same or similar elements will be denoted by the same or similar reference numerals, and redundant descriptions will be omitted or briefly described.

Figure 11:
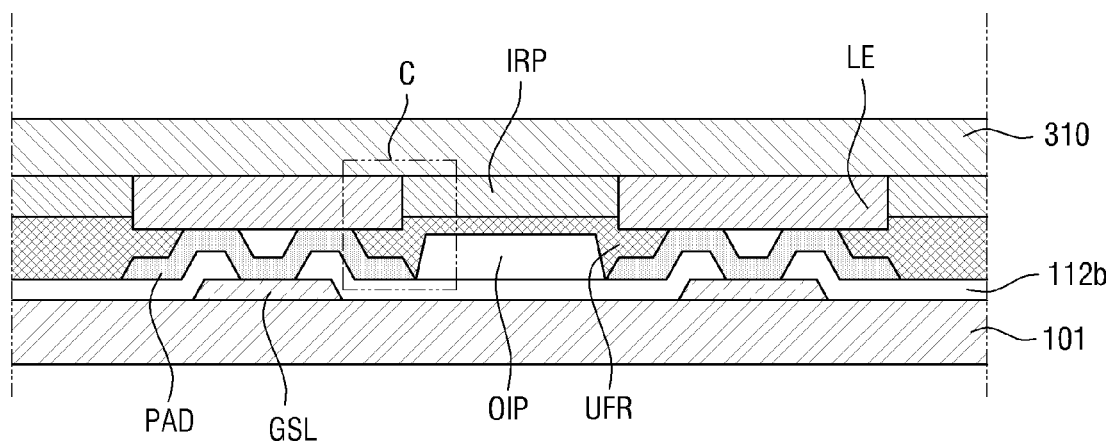
FIG. 11 is a cross-sectional view of a pad area and a printed circuit board attached to the pad area of a display panel according to another exemplary embodiment.
Figure 12:
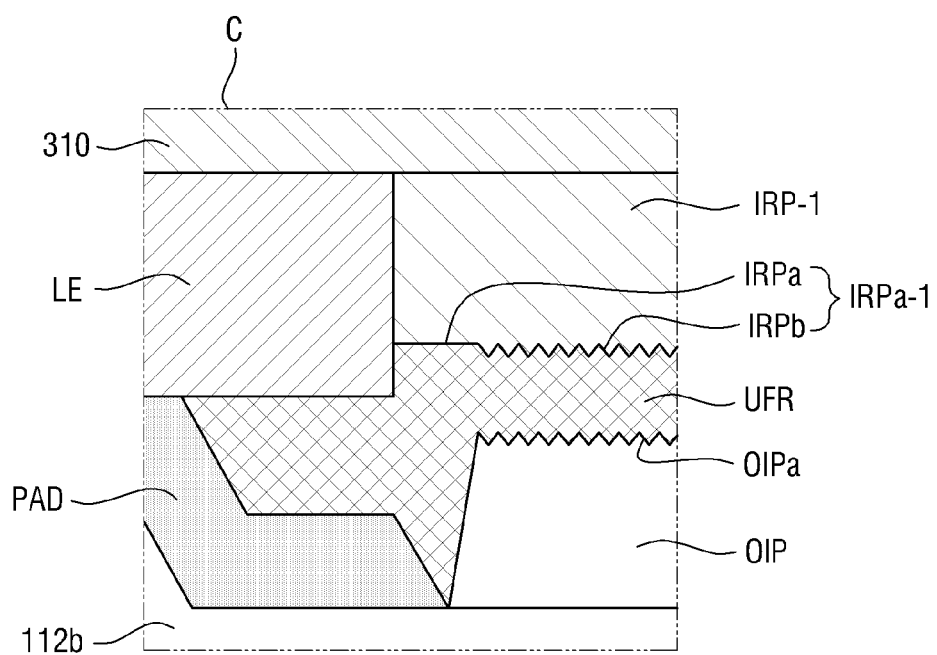
FIG. 12 is an enlarged view of portion C of FIG. 11.

FIG. 11 is a cross-sectional view of a pad area and a printed circuit board attached to the pad area of a display panel according to another exemplary embodiment. FIG. 12 is an enlarged view of portion C of FIG. 11.

A display device 2 according to the illustrated exemplary embodiment shown in FIGS. 11 and 12 is substantially identical to the display device 1, except that an organic insulation pattern OIP is further disposed between adjacent signal wirings PAD.

More particularly, in the display device 2 according to the illustrated exemplary embodiment, an organic insulation pattern OIP may be further disposed between adjacent signal wirings PAD. The organic insulation pattern OIP may be disposed on the display substrate 101. The organic insulation pattern OIP may include substantially the same material as the first via layer VIA1 or the second via layer VIA2 described above with reference to FIG. 2, and may be formed together via the same process.

As the organic insulation pattern OIP is disposed between adjacent signal wirings PAD, a short-circuit may be prevented between the adjacent signal wirings PAD. In addition, the organic insulation pattern OIP may prevent a portion of the base film 310 not disposed with the lead line LE from sagging too much, when load is applied to the base film 310.

The second curable pattern UFR may be disposed between the organic insulation pattern OIP and the first curable pattern IRP. The upper surface and the side surfaces of the organic insulation pattern OIP may be in direct contact with the second curable pattern UFR.

As shown in FIG. 12, a lower surface IRPa_1 of a first curable pattern IRP_1 may include a first portion IRPa and a second portion IRPb. A first roughness of the first portion IRPa may be less than a second roughness of the second portion IRPb. In other words, the second roughness may be larger than the first roughness. The second portion IRPb may overlap with the upper surface OIPa of the organic insulation pattern OIP. In addition, the upper surface OIPa of the organic insulation pattern OIP may include a surface scratch. This is because when the vibration transferer 740 of the ultrasonic apparatus 700 applies load to the printed circuit board 300 downward, the second portion IRPb may be brought into contact with the upper surface OIPa of the organic insulation pattern OIP, which may change the surface roughness of the organic insulation pattern OIP due to the vibration.

According to the illustrated exemplary embodiment, the first curable pattern IRP_1 is disposed between adjacent lead wirings LE in the display device 2, and thus, it is possible to prevent the lead line LE from being peeled off from the printed base film 310.

When the printed base film 310 and the lead wirings LE are raised after the ultrasonic bonding process is completed, the deformation rate of the printed base film 310 in the thickness direction may be greater in a portion where the lead wirings LE are not disposed than a portion where the lead wirings LE are disposed. According to the illustrated exemplary embodiment, the first curable pattern IRP_1 has a surface height lower than the lead wirings LE from the printed base film 310, and is spaced apart from the display substrate 101 disposed thereunder, but includes a material having a higher curing rate than the second curable pattern UFR described above. Accordingly, it is possible to reduce the deformation rate of the printed base film 310 in a portion where the lead wirings LE are not disposed. In this manner, it is possible to prevent the edges of the lead wirings LE from being peeled off from the printed base film 310 due to the larger deformation rate of the printed base film 310 in a portion where the lead wirings LE are not disposed.

Figure 13:
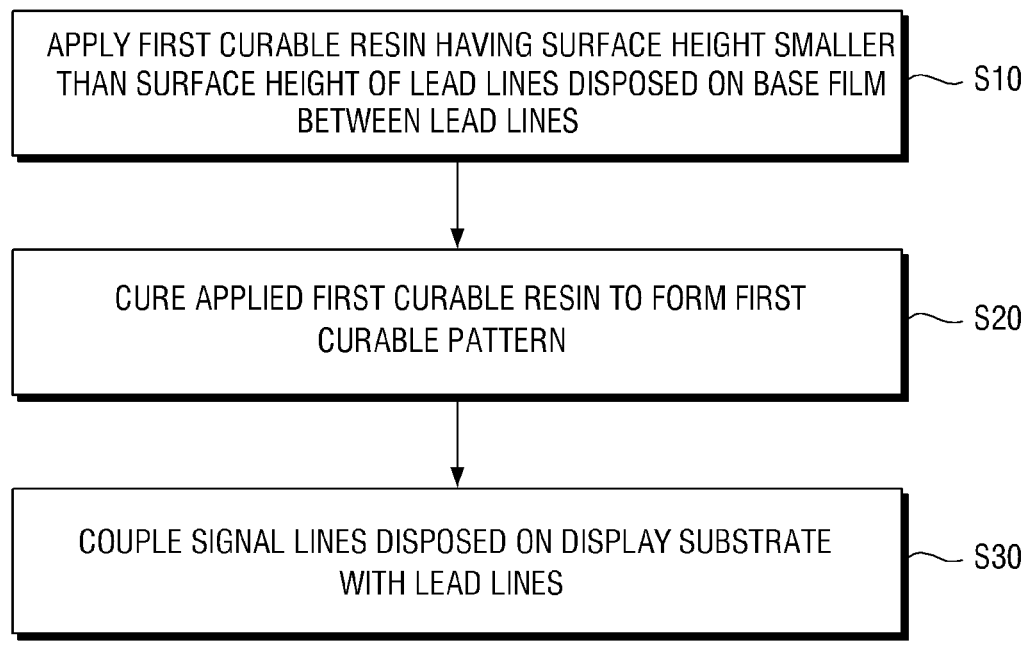
FIG. 13 is a flowchart for illustrating a method for fabricating a display device according to an exemplary embodiment.

FIG. 13 is a flowchart illustrating a method for fabricating a display device according to an exemplary embodiment. FIGS. 14 to 18 are cross-sectional views illustrating a method of fabricating a display device according to an exemplary embodiment.

Figure 14:
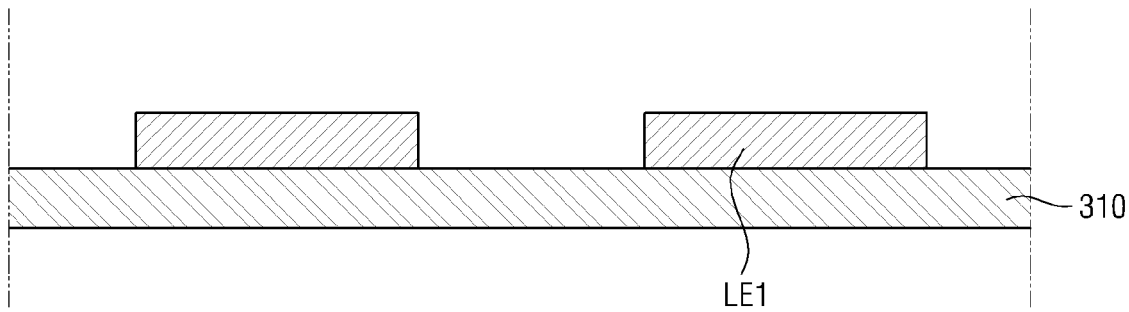
FIGS. 14, 15, 16, 17, and 18 are cross-sectional views illustrating a method of fabricating a display device according to an exemplary embodiment.
Figure 15:
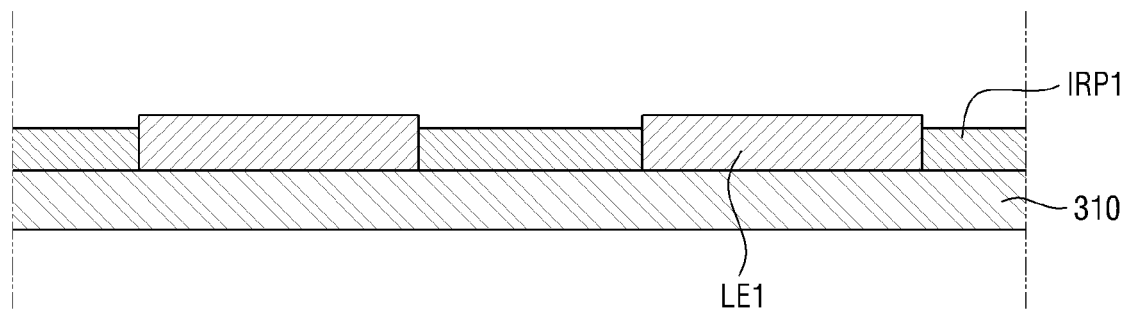

Referring to FIGS. 13 to 15, a first curable resin IRP1 having a surface height smaller than or equal to the surface height of the lead wirings LE is applied between adjacent lead wirings LE disposed on the printed base film 310 (step S10).

The step S10 of applying the first curable resin may include forming a plurality of lead wirings LE on the printed base film 310 as shown in FIG. 14. The lead wirings LE may be formed via a deposition process, for example.

The lead wirings LE may include metal. The lead wirings LE may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an exemplary embodiment, the lead wirings LE may include copper (Cu) and gold (Au). More particularly, the lead wirings LE may include copper (Cu) disposed on the printed base film 310 and gold (Au) disposed on the copper (Cu).

After forming the plurality of lead wirings LE on the printed base film 310, the first curable resin IRP1 may be applied, such that the a surface height of the first curable resin IRP1 is less than or equal to the surface height of the lead wirings LE.

The first curable resin IRP1 may include a photo-curable resin, for example.

The first curable resin IRP1 may be disposed on the printed base film 310. The first curable resin IRP1 may be disposed between adjacent lead wirings LE. The first curable resin IRP1 may be in contact with a part of the lower surface of the printed base film 310 exposed between the lead wirings LE. The first curable resin IRP1 may be in contact with at least a part of the side surface of the lead wirings LE.

Figure 16:
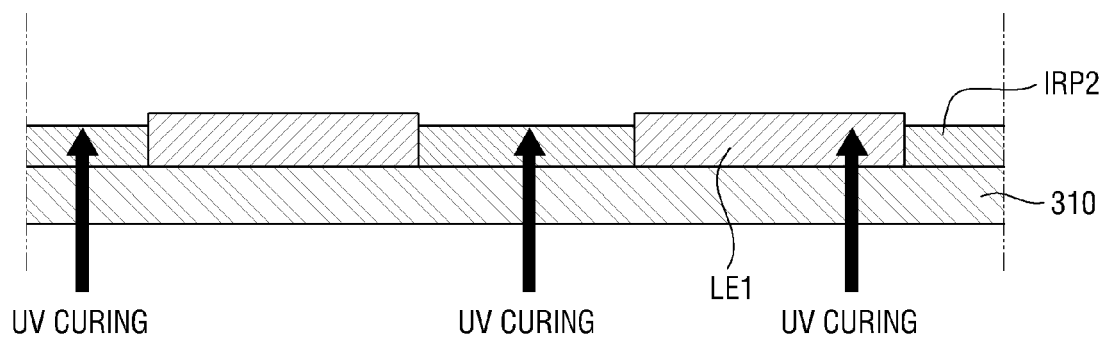

Subsequently, referring to FIGS. 13 and 16, the applied first curable resin IRP1 is cured, such that a first curable pattern IRP2 is formed (step S20).

The step S20 of curing the first curable resin IRP1 to form the first curable pattern IRP2 may be performed using an ultraviolet laser.

The first curable pattern IRP2 may have a third average curing rate after the curing process using the ultraviolet laser. The third average curing rate may be less than the first average curing rate.

Subsequently, referring to FIGS. 9 and 13, the signal wirings PAD and the lead wirings LE on the display substrate 101 are ultrasonically bonded or bonded with each other.

More specifically, the signal wirings PAD and the lead wirings LE on the display substrate 101 may be ultrasonically bonded or bonded with each other by using the ultrasonic apparatus 700. By applying the vibration and load to the printed circuit board 300 downwardly through the vibration transferer 740 of the ultrasonic apparatus 700, the printed base film 310 and the lead wirings LE may be lowered downwardly. As described above, the lead wirings LE may be connected directly to the signal wirings PAD, respectively.

When the lead line LE is ultrasonically vibrated on the surface of the signal line PAD, a frictional force is generated at the interface between the signal line PAD and the lead line LE, such that frictional heat may be generated due to the frictional force. When the frictional heat is high enough to melt the materials of the signal line PAD and the lead line LE, a melting region PADb of the signal line PAD adjacent to the lead line LE and a melting region LEb of the lead line LE adjacent to the signal line PAD may be melted. More particularly, the signal line PAD may include a non-melting region PADa and the melting region PADb. Likewise, the lead line LE may include a non-melting region LEa and the melting region LEb.

Subsequently, referring to FIGS. 10 and 13, after the ultrasonic bonding process is completed, the vibration transferer 740 of the ultrasonic apparatus 700 is separated from the upper surface of the printed base film 310.

Then, the printed base film 310 and the lead wirings LE may be raised back to the previous positions. Due to the ultrasonic bonding, a second coupling force F2 between the signal line PAD and the lead line LE may be greater than a first coupling force F1 between the lead line LE and the printed base film 310. As such, the lead wirings LE may be peeled off from the printed base film 310.

In view of the above, according to an exemplary embodiment, the ultrasonic bonding process may be performed while the first curable pattern IRP2 is between adjacent lead wirings LE, such that the lead line LE may be prevented from being peeled off from the printed base film 310.

Figure 17:
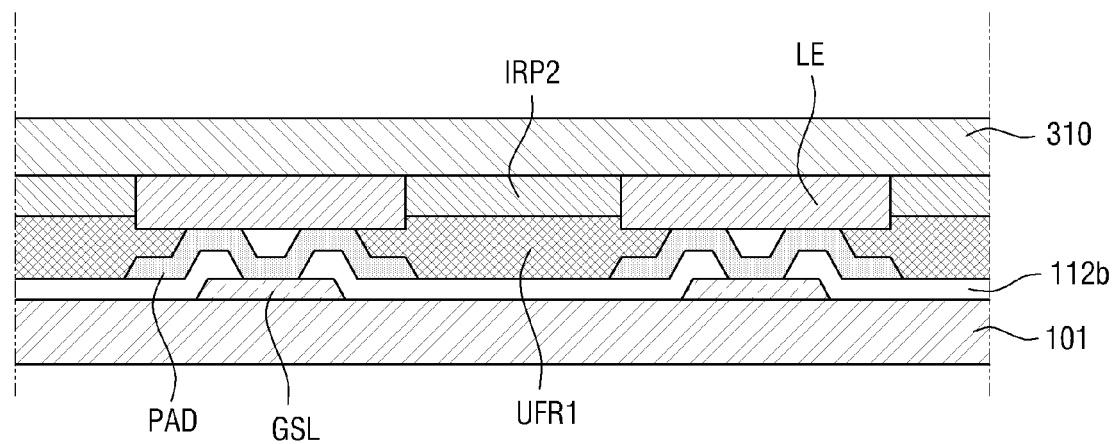

Subsequently, referring to FIGS. 13 and 17, a second curable resin UFR1 is applied between the first curable pattern IRP2 and the display substrate 101.

The second curable resin UFR1 may be disposed between adjacent signal wirings PAD. The second curable resin UFR1 may be expanded to the end of the panel pad area P_PA of the display substrate 101. The second curable resin UFR1 may surround the longer side edges of the signal wirings PAD and the shorter side edge adjacent to the display area DA, but may not surround the lower shorter side edge of the signal wirings PAD when viewed from the top.

The second curable pattern UFR1 may be in contact with a part of the lower surface of each of the lead wirings LE that faces the upper surface of the signal wirings PAD, and with a part of the side surface of each of the lead wirings LE. The second curable pattern UFR1 may be in contact with and overlap with the first curable pattern IRP2 in the thickness direction. The second curable resin UFR1 may be disposed between adjacent signal wirings PAD.

A part of the second curable pattern UFR1 may be in contact with the first curable pattern IRP2 disposed thereon, and the other part thereof may not be in contact with the first curable pattern IRP2t.

Figure 18:
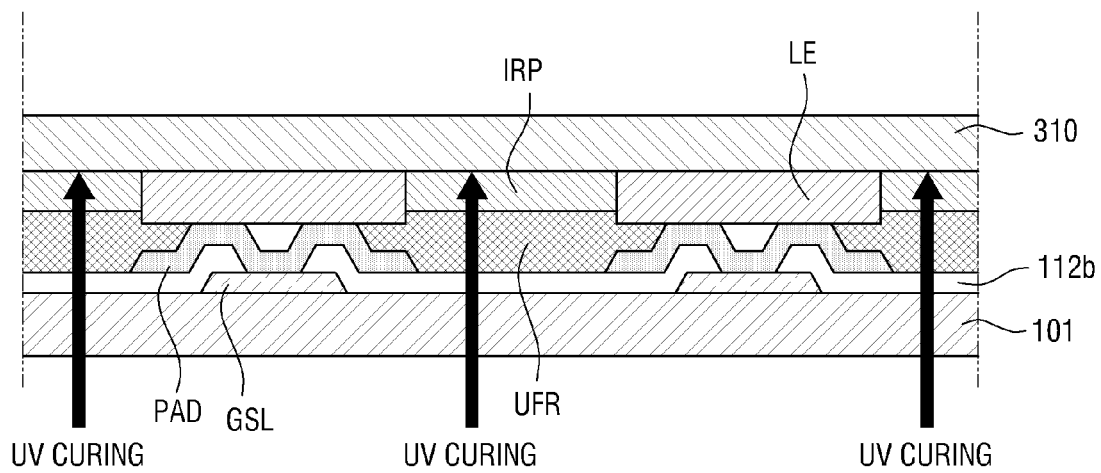

Subsequently, referring to FIG. 18, the first curable pattern IRP2 and the second curable resin UFR1 are cured to form a first curable pattern IFP1 and a second curable pattern UFR, respectively.

The curing the first curable pattern IRP2 and the second curable resin UFR1 may be performed by using an ultrasonic laser, as when forming the first curable pattern IRP2.

The first curable pattern IFP1 may have the first average curing rate, and the second curable pattern UFR may have the second average curing rate. The first average curing rate may be greater than the second average curing rate.

When the printed base film 310 and the lead wirings LE are raised after the ultrasonic bonding process is completed, the deformation rate of the printed base film 310 in the thickness direction may be greater in a portion where the lead wirings LE are not disposed than a portion where the lead wirings LE are disposed. As such, according to an exemplary embodiment, the first curable pattern IRP has a surface height lower than the lead wirings LE from the printed base film 310, and is spaced apart from the display substrate 101 disposed thereunder, but it includes a material having a higher curing rate than the second curable pattern UFR, as described above. Accordingly, it is possible to reduce the deformation rate of the printed base film 310 in a portion where the lead wirings LE are not disposed. In this manner, it is possible to prevent the edges of the lead wirings LE from being peeled off from the printed base film 310 due to the greater deformation rate of the printed base film 310 in a portion where the lead wirings LE are not disposed.

Figure 19:
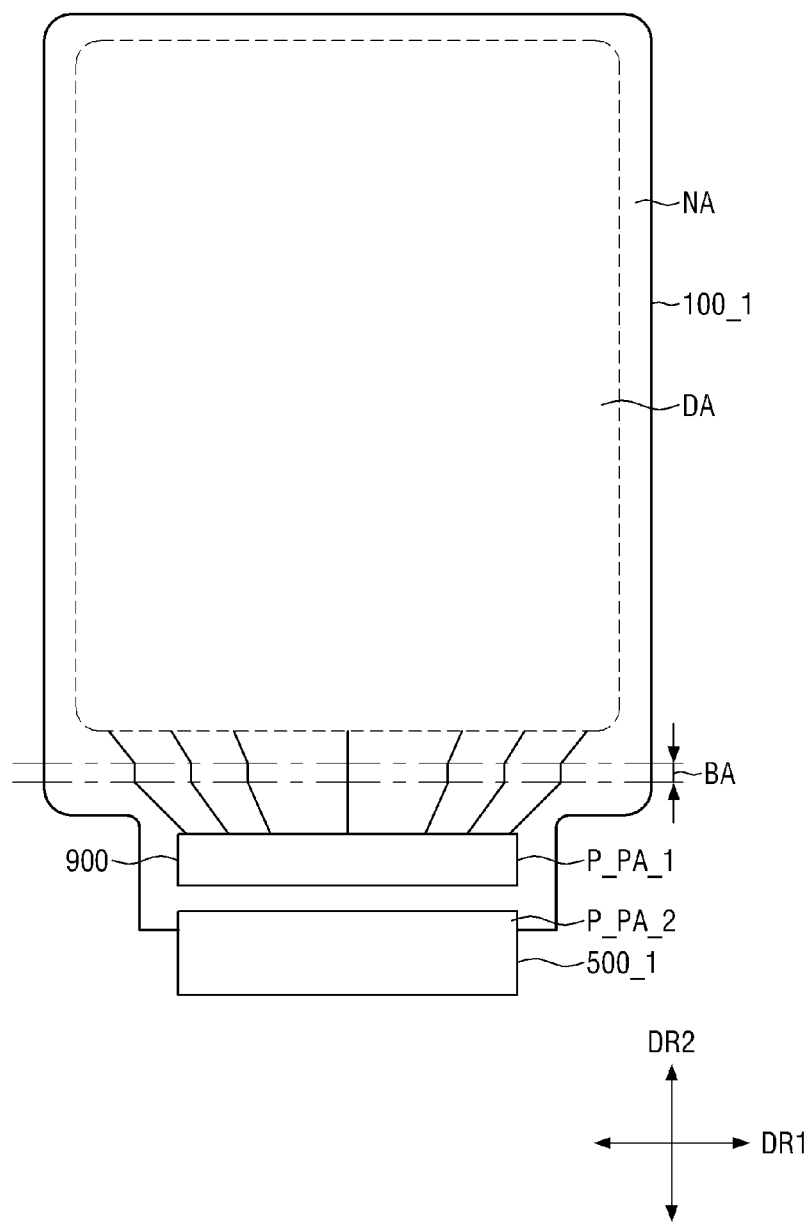
FIG. 19 is a plan view of a display device according to yet another exemplary embodiment.
Figure 20:
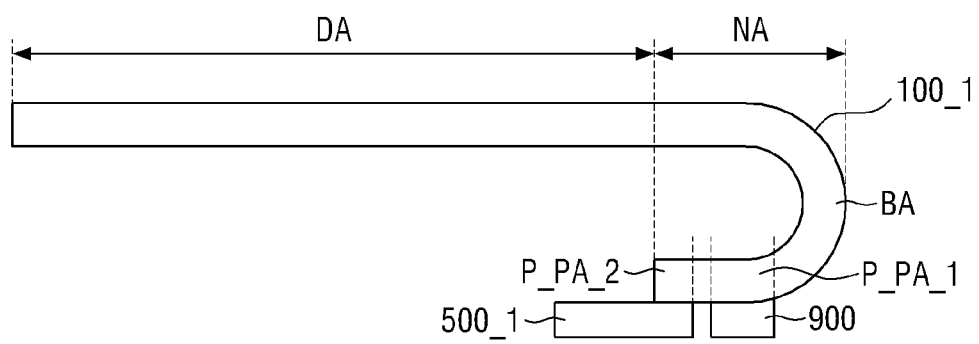
FIG. 20 is a cross-sectional view of a display device according to yet another exemplary embodiment.

FIG. 19 is a plan view of a display device according to yet another exemplary embodiment. FIG. 20 is a cross-sectional view of a display device according to yet another exemplary embodiment.

Referring to FIGS. 19 and 20, a display panel 100_1 of a display device 3 according to the illustrated exemplary embodiment may further include a bending area BA.

The display substrate of the display panel 100_1 may be made of an insulating material such as a polymer resin. The material of the polymer resin may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The display substrate may be a flexible substrate that can be bent, folded, or rolled, and may include polyimide (PI), without being limited thereto.

The bending area BA may be formed between an array of pixels and a panel pad area P_PA_1. The bending area BA may be located in the non-display area NA. The display panel 100_1 may be folded with respect to the bending line, which is the reference line disposed in the bending area BA. The bending line may be a straight line substantially parallel to the lower side (or the upper side) of the display panel 100_1. The bending area BA of a display panel 100_4 may be bent downward in the third direction DR3, as shown in FIG. 20.

In some exemplary embodiments, the display area DA and the panel pad area P_PA_1 may be connected to each other without the bending area BA. More particularly, the entire display area DA and non-display area NA may be substantially flat without the bending area BA in the display panel 100_1.

In the panel pad area P_PA_1, the plurality of signal wirings PAD described above with reference to FIG. 3 is disposed. A driver integrated circuit 900 may be attached to the plurality of signal wirings PAD.

According to an exemplary embodiment, a chip-on-plastic (COP) or a chip-on-glass (COG) may be employed as the driver integrated circuit 900. The driver integrated circuit 900 may include a plurality of bumps connected to the plurality of signal wirings PAD, respectively. The bumps may be formed of at least one of gold (Au), nickel (Ni), and tin (Sn).

According to an exemplary embodiment, the bumps of the driver integrated circuit 900 may be in contact with and be bonded to the respective signal wirings PAD directly, without layers or structures interposed therebetween. The bumps and the signal wirings PAD of the driver integrated circuit 900 may be bonded with each other by ultrasonic bonding.

According to exemplary embodiments, it is possible to prevent a lead line from being peeled off from a base film of a printed circuit board.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel including a display substrate having a display area and a pad area around the display area, and a plurality of signal wirings disposed in the pad area of the display substrate;
    a base film attached to the pad area of the display substrate;
    a plurality of lead wirings disposed on the base film and connected to the plurality of signal wirings; and
    a first curable pattern disposed between adjacent ones of the lead wirings,
    wherein a surface height of the first curable pattern from a surface of the base film is less than a surface height of the lead wirings from the surface of the base film.

2. The display device of claim 1, wherein the first curable pattern is spaced apart from the display substrate.

3. The display device of claim 2, wherein the first curable pattern is in contact with the surface of the base film and at least a part of a side surface of the lead wirings.

4. The display device of claim 3, wherein the first curable pattern is bonded with the surface of the base film and at least a part of the side surface of the lead wirings.

5. The display device of claim 3, further comprising a second curable pattern disposed between adjacent ones of the signal wirings on the display substrate,
    wherein a first portion of the second curable pattern contacts the first curable pattern and a second portion of the second curable pattern does not contact the first curable pattern, the second curable pattern being partially in contact with the first curable pattern with voids formed therebetween.

6. The display device of claim 5, wherein:
    the first curable pattern exposes a lower end of a side surface of each of the lead wirings; and
    the second curable pattern is in contact with the exposed lower end of the side surface of the lead wirings.

7. The display device of claim 6, wherein the first curable pattern is in contact with a lower surface of each of the lead wirings that faces an upper surface of a respective one of the signal wirings, and with an upper surface of each of the signal wirings.

8. The display device of claim 5, wherein the first curable pattern comprises a curable resin having a first average curing rate, and the second curable pattern comprises a curable resin having a second average curing rate less than the first average curing rate.

9. The display device of claim 5, wherein the second curable pattern is disposed closer to the display area than the first curable pattern.

10. The display device of claim 5, further comprising an organic insulation pattern disposed on the display substrate and between adjacent ones of the signal wirings,
wherein the second curable pattern is disposed between the organic insulation pattern and the first curable pattern.

11. The display device of claim 10, wherein:
a lower surface of the first curable pattern that faces the organic insulation pattern includes a first lower surface having a first roughness and a second lower surface having a second roughness greater than the first roughness; and
the second lower surface overlaps with an upper surface of the organic insulation pattern in a thickness direction.

12. The display device of claim 11, wherein the second lower surface of the first curable pattern and the upper surface of the organic insulation pattern have a scratch.

13. The display device of claim 1, wherein the signal wirings are connected directly to the lead wirings.

14. The display device of claim 13, wherein the signal wirings are configured to be bonded to the lead wirings by ultrasonic bonding.

15. A method of fabricating a display device, the method comprising the steps of:
providing a display panel including a display substrate having a display area and a pad area around the display area, and a plurality of signal wirings disposed in the pad area of the display substrate;
attaching a base film to the pad area of the display substrate;
providing a plurality of lead wirings on the base film;
applying a first curing resin on the base film between adjacent ones of the lead wirings;
curing the applied first curing resin to form a first curable pattern; and
coupling the signal wirings disposed on the display substrate with the lead wirings,
wherein a surface height of the first curable pattern from a surface of the base film is less than a surface height of the lead wirings from the surface of the base film.

16. The method of claim 15, wherein the step of coupling the signal wirings with the lead wirings comprises bringing the signal wirings into direct contact with the lead wirings.

17. The method of claim 16, wherein the step of bringing the signal wirings to the lead wirings comprises ultrasonically bonding the signal wirings with the lead wirings.

18. The method of claim 15, wherein the step of curing the applied first curing resin comprises forming the first curable pattern using a UV laser.

19. The method of claim 15, further comprising applying a second curable resin after the signal wirings disposed on the display substrate are coupled with the lead wirings.

20. The method of claim 19, further comprising curing the first curable pattern and the second curing resin simultaneously after applying the second curable resin.

* * * * *